(12) United States Patent
Chung

(10) Patent No.: US 8,941,142 B2
(45) Date of Patent: Jan. 27, 2015

(54) ORGANIC LIGHT-EMITTING DISPLAY DEVICE AND METHOD OF MANUFACTURING THE SAME

(71) Applicant: Samsung Display Co., Ltd., Yongin-si, Gyeonggi-Do (KR)

(72) Inventor: In-Young Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/781,354

(22) Filed: Feb. 28, 2013

(65) Prior Publication Data

US 2014/0138631 A1    May 22, 2014

(30) Foreign Application Priority Data

Nov. 19, 2012   (KR) .................. 10-2012-0131117

(51) Int. Cl.
*H01L 27/32*   (2006.01)
*H01L 33/00*   (2010.01)
*H01L 51/52*   (2006.01)

(52) U.S. Cl.
CPC .............................. *H01L 51/5228* (2013.01)
USPC .......................................... 257/99; 257/40

(58) Field of Classification Search
USPC .......... 257/79, 87, 88, E33.062, 40; 313/505, 313/506, 498
See application file for complete search history.

(56) References Cited

U.S. PATENT DOCUMENTS

| | | | |
|---|---|---|---|
| 6,768,257 B1 | 7/2004 | Yamada et al. | |
| 7,214,967 B2 * | 5/2007 | Park et al. | 257/91 |
| 2004/0263441 A1 * | 12/2004 | Tanaka et al. | 345/76 |
| 2005/0007014 A1 * | 1/2005 | Kurata | 313/504 |
| 2005/0186801 A1 * | 8/2005 | Uno et al. | 438/706 |
| 2005/0258436 A1 * | 11/2005 | Arai | 257/81 |
| 2006/0220544 A1 * | 10/2006 | Okuyama et al. | 313/506 |
| 2007/0159043 A1 * | 7/2007 | Kubota et al. | 313/110 |
| 2008/0197778 A1 * | 8/2008 | Kubota | 315/73 |
| 2009/0021134 A1 * | 1/2009 | Matsudate et al. | 313/326 |
| 2009/0066236 A1 * | 3/2009 | Sung et al. | 313/504 |
| 2009/0079328 A1 * | 3/2009 | Fedorovskaya et al. | 313/504 |
| 2009/0096371 A1 * | 4/2009 | Matsudate et al. | 313/505 |
| 2009/0239321 A1 * | 9/2009 | Shimoda et al. | 438/29 |
| 2009/0278454 A1 * | 11/2009 | Fedorovskaya et al. | 313/512 |
| 2010/0127273 A1 * | 5/2010 | Kim | 257/72 |

(Continued)

FOREIGN PATENT DOCUMENTS

| | | |
|---|---|---|
| JP | 2001-195008 | 7/2001 |
| JP | 2008-041297 | 2/2008 |
| JP | 2008-41341 A | 2/2008 |
| JP | 2010-027504 | 2/2010 |
| KR | 10-2007-0087905 A | 8/2007 |

(Continued)

OTHER PUBLICATIONS

KIPO Office Action; KR Serial No. 10-2012-0131117, issued on Dec. 12, 2013, 4 pages.

(Continued)

*Primary Examiner* — Michele Fan
(74) *Attorney, Agent, or Firm* — Christie, Parker & Hale, LLP

(57) ABSTRACT

An organic light emitting display device including a sub-pixel including a pixel electrode, a counter electrode, and a light emitting layer between the pixel electrode and the counter electrode, a planarization layer covering the counter electrode, and an auxiliary electrode in the planarization layer and coupled to the counter electrode.

4 Claims, 3 Drawing Sheets

(56) References Cited

U.S. PATENT DOCUMENTS

| | | | |
|---|---|---|---|
| 2010/0140595 A1* | 6/2010 | Lee et al. | 257/40 |
| 2011/0114941 A1 | 5/2011 | Kato et al. | |
| 2011/0187629 A1* | 8/2011 | Nam et al. | 345/76 |
| 2011/0220900 A1* | 9/2011 | Ha et al. | 257/59 |
| 2011/0303930 A1 | 12/2011 | Bang et al. | |
| 2012/0001184 A1* | 1/2012 | Ha et al. | 257/59 |
| 2012/0074454 A1* | 3/2012 | Lifka et al. | 257/99 |
| 2012/0211775 A1* | 8/2012 | Hosoya et al. | 257/88 |

FOREIGN PATENT DOCUMENTS

| | | | |
|---|---|---|---|
| KR | 2007087905 A | * | 8/2007 |
| KR | 10-0848342 B1 | | 7/2008 |
| KR | 10-2011-0135734 | | 12/2011 |
| KR | 10-2012-0089323 | | 8/2012 |

OTHER PUBLICATIONS

KIPO Registration Determination Certificate dated May 23, 2014, for Korean priority Patent application 10-2012-0131117, (6 pages).

* cited by examiner

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0131117, filed on Nov. 19, 2012 in the Korean Intellectual Property Office, the disclosure of which is incorporated herein in its entirety by reference.

BACKGROUND

1. Field

Embodiments of the present invention relate to an organic light emitting display device and a method of manufacturing the same, and more particularly, to an organic light emitting display device having a structure for reducing or preventing a voltage drop at a counter electrode and a method of manufacturing the organic light emitting display device.

2. Description of the Related Art

Generally, an organic light emitting display device has a stacked structure in which a light emitting layer is located between a pixel electrode, which is an anode, and a counter electrode, which is a cathode. Colors are formed when holes and electrons respectively injected from anodes and cathodes are recombined at a light emitting layer that emits light.

A unit pixel of such an organic light emitting display device includes sub-pixels including a red sub-pixel, a green sub-pixel, and a blue sub-pixel, and a desired color is formed by a combination of three colors of the sub-pixels. In other words, each of the sub-pixels has a structure in which a light emitting layer emitting one color from among red, green, and blue is located between two electrodes, and a color of the unit pixel is formed by suitably combining lights of the three colors.

Furthermore, the counter electrode is generally formed as a thin metal film that covers all sub-pixels. However, since the thickness of a metal film is inversely proportional to the resistance of the metal film, a voltage drop frequently occurs due to the high resistance of the counter electrode. As a result, it may be difficult to form clear images and the reliability of the organic light emitting display having this structure is low. Therefore, it is necessary to resolve these problems.

SUMMARY

Embodiments of the present invention provide an organic light emitting display device having a structure for reducing or preventing a voltage drop at a counter electrode and a method of manufacturing the organic light emitting display device.

According to an aspect of embodiments of the present invention, there is provided an organic light emitting display device including a sub-pixel including a pixel electrode, a counter electrode, and a light emitting layer between the pixel electrode and the counter electrode, a planarization layer covering the counter electrode, and an auxiliary electrode in the planarization layer and coupled to the counter electrode.

A groove may be defined by a side of the planarization layer opposite the counter electrode, a penetration hole in the planarization layer may extend through the planarization layer toward the counter electrode from the groove, and the auxiliary electrode may be located in the groove and the penetration hole.

The auxiliary electrode may include silver (Ag).

The planarization layer may include an organic layer.

According to another aspect of the present invention, there is provided a method of manufacturing an organic light emitting display device, the method including forming sub-pixels on a base substrate, each sub-pixel including a pixel electrode, a counter electrode, and a light emitting layer between the pixel electrode and the counter electrode, forming a planarization layer over the counter electrode, and forming an auxiliary electrode in the planarization layer and coupled to the counter electrode.

The forming of the auxiliary electrode may include forming a groove and a penetration hole in the planarization layer, and filling the groove and the penetration hole with the auxiliary electrode to couple the counter electrode to the auxiliary electrode.

Forming the groove and the penetration hole may include selectively removing one or more portions of the planarization layer using a mask including a full exposure portion, a half exposure portion, and a shading portion, the penetration hole may be in an area corresponding to the full exposure portion, and the groove may be in an area corresponding to the half exposure portion.

The forming of the auxiliary electrode may include depositing a material on a surface of the planarization layer, filling the groove and the penetration hole by radiating a laser on a portion of the material corresponding to the groove and penetration hole to melt the portion of the material, and removing a remaining portion of the material other than the portion of the material corresponding to the groove and penetration hole.

The auxiliary electrode may include silver (Ag).

The planarization layer may include an organic layer.

Therefore, according to an organic light emitting display device and a method of manufacturing the organic light emitting display device according to embodiments of the present invention, a voltage drop may be effectively reduced by coupling an auxiliary electrode to a counter electrode through a planarization layer, thereby improving the reliability of the organic light emitting display device.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

As used herein, the term "and/or" includes any and all combinations of one or more of the associated listed items.

Hereinafter, exemplary embodiments of the present invention will be described in detail with reference to the attached drawings.

Figure 1:
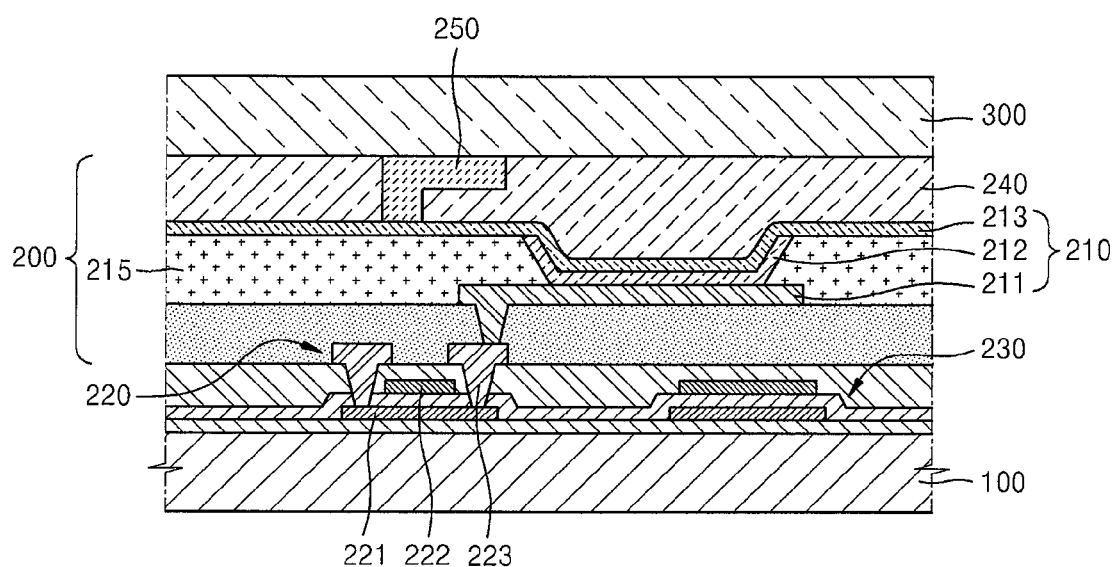
FIG. 1 is a cross-sectional view illustrating an organic light emitting display device according to an embodiment of the present invention.

FIG. 1 is a cross-sectional view illustrating an organic light emitting display device according to an embodiment of the present invention. As illustrated in FIG. 1, the organic light emitting display device according to the present embodiment includes a base substrate 100, a display unit 200 formed thereon, and an encapsulation layer 300 covering the display unit 200.

The display unit 200 includes a thin-film transistor (TFT) 220, a capacitor 230, and an organic light emitting device 210. FIG. 1 shows a sub-pixel of the display unit 200 of the organic light emitting display device, and a plurality of such sub-pixels may be arranged in rows and columns on the base substrate 100.

The TFT 220 includes an active layer 221 formed on the base substrate 100, a gate electrode 222 facing the active layer 221, and source and drain electrodes 223 that are respectively coupled to the active layer 221 and a pixel electrode 211 of the organic light emitting device 210. Therefore, when a suitable voltage is applied to the gate electrode 222, a current flows to the pixel electrode 211 via the active layer 221 and the source and drain electrodes 223.

Furthermore, the organic light emitting device 210 includes the pixel electrode 211, a light emitting layer 212 formed in a pixel defining layer 215 surrounding the pixel electrode 211, and a counter electrode 213 formed on all of the sub-pixels of the display unit 200. Therefore, when a voltage is applied by the TFT 220 to the pixel electrode 211 and a suitable voltage exists between the pixel electrode 211 and the counter electrode 213, the light emitting layer 212 emits light.

In the case of a front light-emitting structure, where an image is formed towards the counter electrode 213, the pixel electrode 211 may be formed as a reflective electrode, and the counter electrode 213 may be formed as a phototransmissive electrode.

The light emitting layer 212 may be formed by stacking a hole injection and transport layer, a light emitting layer, and/or an electron injection and transport layer.

Because the counter electrode 213 is generally formed of a thin metal film, the counter electrode 213 has high resistance, and thus, a voltage drop may occur. Therefore, to resolve this problem, a planarization layer 240 formed of an organic layer material is formed on the counter electrode 213, and an auxiliary electrode 250 is formed in the planarization layer 240 to be electrically coupled to the counter electrode 213 in the present embodiment. In other words, the auxiliary electrode 250 is formed in the planarization layer 240 covering the counter electrode 213 such that the auxiliary electrode 250 is coupled to the counter electrode 213 through the planarization layer 240. As a result, a voltage may also be applied to the counter electrode 213 via the auxiliary electrode 250, and thus, a voltage drop at the counter electrode 213 may be significantly reduced.

The organic light emitting display device having the structure as described above may be manufactured as described below.

Figure 2A:
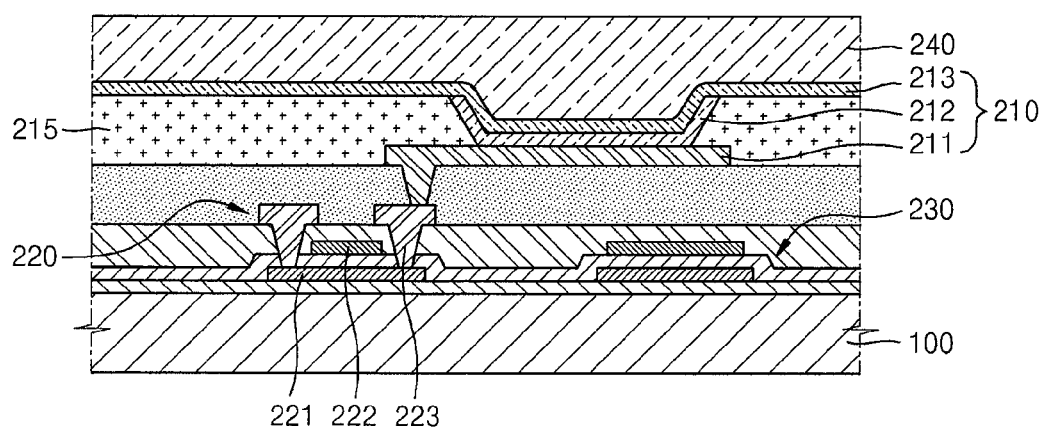
FIGS. 2A through 2E are cross-sectional views illustrating processes of manufacturing the organic light emitting display device of FIG. 1.

First, as shown in FIG. 2A, the display unit 200 including the TFT 220, the organic light emitting device 210, and the capacitor 230 is formed on the base substrate 100. Since a process for forming the display unit 200 is well-known in the art, detailed descriptions thereof will be omitted.

The planarization layer 240, which is formed of the organic layer material such as, for example, polyimide or hybrid silicon on glass (SOG), is formed on the counter electrode 213 of the organic light emitting device 210.

Figure 2B:
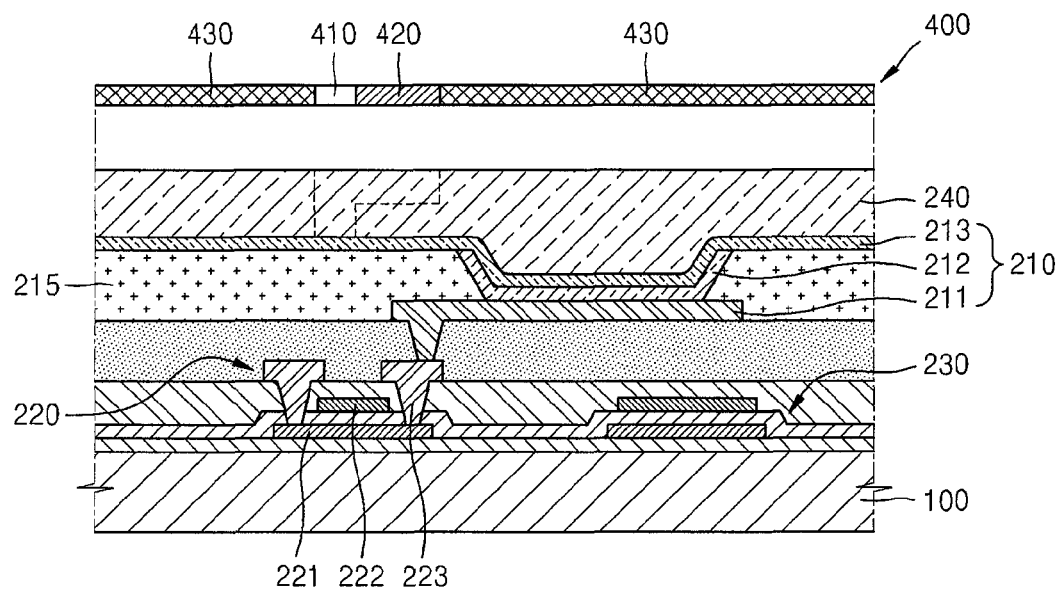

The planarization layer 240, or a portion thereof, is exposed by using the mask 400 as illustrated in FIG. 2B to be selectively removed from corresponding areas. That is, the mask 400 includes a full exposure portion 410, a half exposure portion 420, and a shading portion 430, and a exposure pattern as indicated by dashed lines in FIG. 2B is formed when the planarization layer 240 is exposed using the mask 400.

Figure 2C:
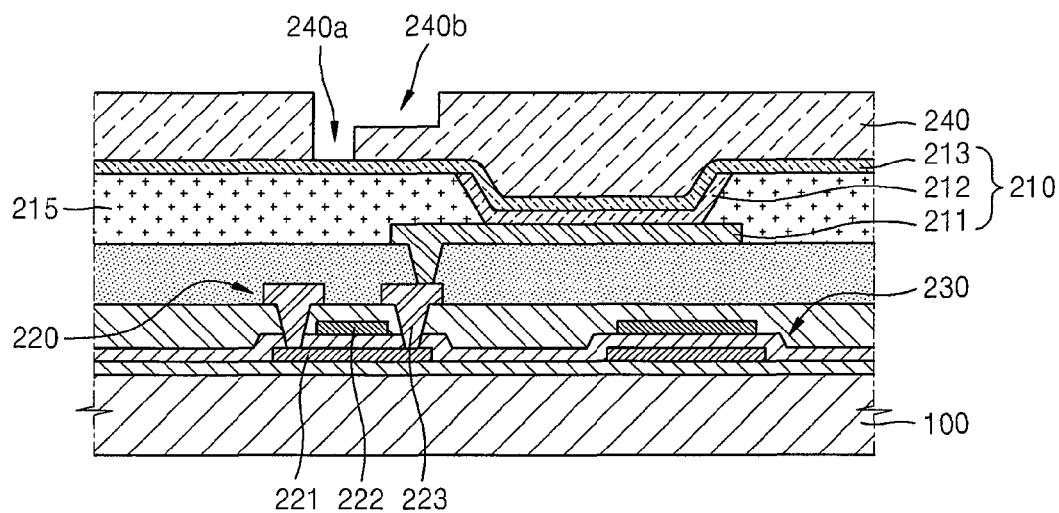

As shown in FIG. 2C, when the exposure pattern is etched, an accommodation groove 240b and a penetration hole 240a are formed in the planarization layer 240. The penetration hole 240a is formed in an area corresponding to the full exposure portion 410, and the accommodation groove 240b is formed in the area corresponding to the half exposure portion 420.

Figure 2D:
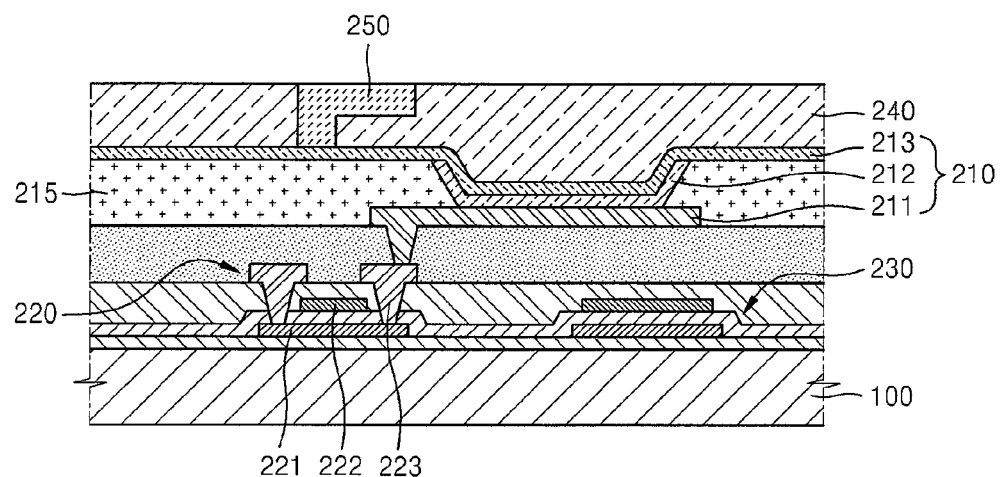

Next, as illustrated in FIG. 2D, the auxiliary electrode 250 is formed in the accommodation groove 240b and penetration hole 240a. As a result, the auxiliary electrode 250 is coupled to the counter electrode 213 through the penetration hole 240a, and thus, a voltage may also be applied to the counter electrode 213 through the auxiliary electrode 250. The auxiliary electrode 250 may be formed by depositing a conductive material such as, for example, silver (Ag) and then partially melting the conductive material using a laser. That is, a material for forming the auxiliary electrode 250 may be deposited on substantially the entire surface of the planarization layer 240, and then, a laser is radiated on a portion of the material corresponding to the accommodation groove 240b and penetration hole 240a to melt the portion of the material. As a result, the portion of the material for the auxiliary electrode 250 is melted, and thus, the melted material fills the accommodation groove 240b and the penetration hole 240a. Next, when a remaining portion of the material for the auxiliary electrode 250 is stripped, a resultant structure as shown in FIG. 2D is obtained. Although a laser is used in the present embodiment, other embodiments of the present invention may allow for the material to be melted by other methods (e.g., heat application).

Figure 2E:
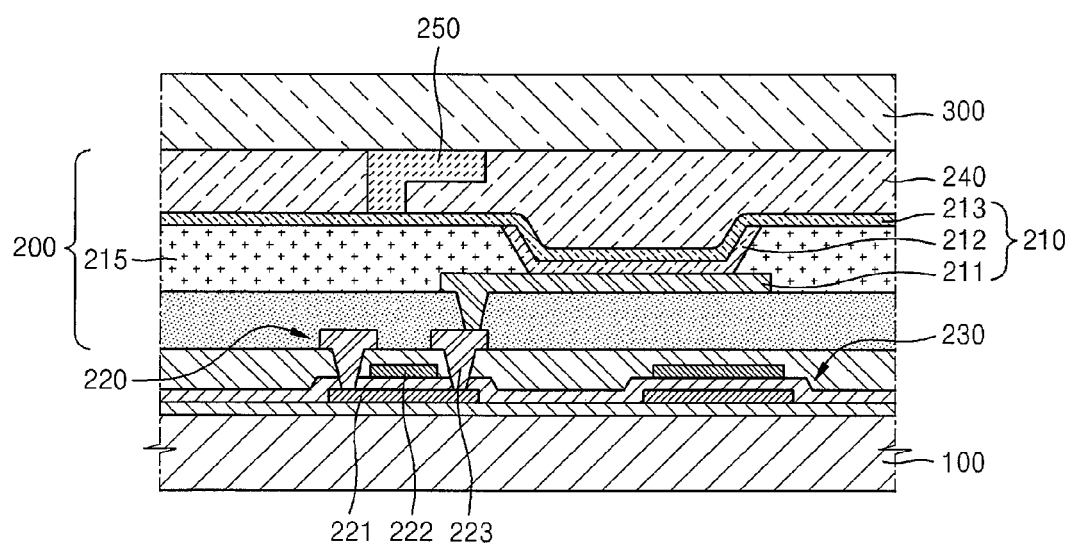

Thereafter, when the encapsulation layer 300 is formed on the resultant structure, the auxiliary electrode 250 and the counter electrode 213 are stably coupled to each other through the planarization layer 240, as illustrated in FIG. 2E.

In the structure described above, a voltage may also be applied to the counter electrode 213 via the auxiliary electrode 250, and thus, a voltage drop at the counter electrode 213 may be reduced or prevented.

Therefore, according to the embodiments of the present invention as described above, a voltage drop may be effectively reduced by coupling the auxiliary electrode to the counter electrode through the planarization layer, thereby improving the reliability of the organic light emitting display device.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:
1. An organic light emitting display device comprising:
a substrate;
a sub-pixel comprising a pixel electrode, a counter electrode, and a light emitting layer between the pixel electrode and the counter electrode disposed on the substrate;
a pixel defining layer surrounding the pixel electrode;
a planarization layer covering the counter electrode and comprising an organic layer;
an encapsulation layer covering the planarization layer; and an auxiliary electrode, comprising a vertical portion and a horizontal portion, in the planarization layer and directly contacting the encapsulation layer, the auxiliary electrode being electrically coupled to the counter electrode and being configured to apply a voltage to the counter electrode, wherein a first area defined by an interface between the auxiliary electrode and a first surface of the counter electrode overlaps a second area defined by an interface between a second surface of the counter electrode and the pixel defining layer, the first surface and the second surface of the counter electrode being opposing sides of the counter electrode, and wherein the horizontal portion of the auxiliary electrode overlaps with a portion of the pixel electrode along a direction perpendicular to the first area and the second area and does not extend entirely to a first edge and a second edge of the substrate, wherein the first edge and the second edge extend in a direction perpendicular to the first area and the second area.

2. The organic light emitting display device of claim 1, wherein a groove is defined by a side of the planarization layer opposite the counter electrode, wherein a penetration hole in the planarization layer extends through the planarization layer toward the counter electrode from the groove, and wherein the auxiliary electrode is located in the groove and the penetration hole.

3. The organic light emitting display device of claim 1, wherein the auxiliary electrode comprises silver (Ag).

4. The organic light emitting display device of claim 1, wherein the auxiliary electrode has a first side and a second side facing the first side, the first and second sides of the auxiliary electrode being between an edge of a source electrode and an edge of a drain electrode of a transistor.

* * * * *